United States Patent
Wu et al.

(10) Patent No.: US 10,750,635 B2
(45) Date of Patent: Aug. 18, 2020

(54) METHOD FOR CONTROLLING HEAT DISSIPATION DEVICE AND ELECTRONIC DEVICE WITH FUNCTION OF CONTROLLING HEAT DISSIPATION DEVICE

(71) Applicant: Realtek Semiconductor Corporation, Hsinchu (TW)

(72) Inventors: Jo-Hua Wu, Pingtung County (TW); Cheng-Yu Chen, New Taipei (TW)

(73) Assignee: Realtek Semiconductor Corporation, Hsinchu (TW)

( * ) Notice: Subject to any disclaimer, the term of this patent is extended or adjusted under 35 U.S.C. 154(b) by 16 days.

(21) Appl. No.: 15/921,687

(22) Filed: Mar. 15, 2018

(65) Prior Publication Data
US 2018/0332733 A1    Nov. 15, 2018

(30) Foreign Application Priority Data
May 12, 2017 (TW) .............................. 106115831 A

(51) Int. Cl.
*H05K 7/20* (2006.01)
*G05B 15/02* (2006.01)
*G06F 1/20* (2006.01)

(52) U.S. Cl.
CPC ......... *H05K 7/20209* (2013.01); *G05B 15/02* (2013.01); *G06F 1/206* (2013.01); *H05K 7/20136* (2013.01)

(58) Field of Classification Search
None
See application file for complete search history.

(56) References Cited

U.S. PATENT DOCUMENTS

| | | | | |
|---|---|---|---|---|
| 5,727,928 A | * | 3/1998 | Brown | F04D 27/008 361/23 |
| 6,407,672 B1 | * | 6/2002 | Grenz | G06F 1/206 340/507 |
| 6,487,463 B1 | * | 11/2002 | Stepp, III | G05D 23/1934 700/299 |
| 6,643,128 B2 | * | 11/2003 | Chu | G06F 1/206 318/471 |
| 6,927,978 B2 | * | 8/2005 | Arai | G06F 1/206 361/695 |
| 2006/0117779 A1 | * | 6/2006 | Liebenow | G01K 13/00 62/259.2 |
| 2012/0224322 A1 | * | 9/2012 | Adman | G06F 1/20 361/679.48 |

FOREIGN PATENT DOCUMENTS

TW     I297429 B     6/2008

* cited by examiner

*Primary Examiner* — Mohamad Ali
*Assistant Examiner* — David Earl Ogg
(74) *Attorney, Agent, or Firm* — CKC & Partners Co., LLC

(57) ABSTRACT

A heat dissipation device control method for dissipating heat from an electronic element without self-heat-dissipation function in an electronic device. The method comprises: detecting a first temperature of the electronic element; and controlling the fan of the peripheral element located around the electronic element when the first temperature exceeds the first upper temperature threshold to dissipate the heat from the electronic element.

20 Claims, 2 Drawing Sheets

METHOD FOR CONTROLLING HEAT DISSIPATION DEVICE AND ELECTRONIC DEVICE WITH FUNCTION OF CONTROLLING HEAT DISSIPATION DEVICE

CROSS-REFERENCE TO RELATED APPLICATION

This application claims the priority benefit of TAIWAN Application serial no. 106115831, filed May 12, 2017, the full disclosure of which is incorporated herein by reference.

FIELD OF INVENTION

The invention relates to an electronic device with a function of controlling a heat dissipation device, and a method for controlling the heat dissipation device. More particularly, the invention relates to the function and the method for controlling the heat dissipation device to dissipate heat from electronic elements that have no self-heat-dissipation function.

BACKGROUND

There are many electronic elements in the electronic device, in which some electronic elements may be equipped with a fan that can actively perform heat dissipation when the electronic elements are overheated. However, some electronic elements do not have a fan or self-heat-dissipation functions. If a fan is additionally installed next to the electronic elements with no self-heat-dissipation functions, although heat from those electronic elements self-heat-dissipation function may be dissipated, extra cost and are needed.

Therefore, how to dissipate the heat of the electronic elements that do not have their own cooling functions without additional space and cost is one of the issued to be improved in the field.

SUMMARY

An aspect of this disclosure is to provide a method for controlling a heat dissipation device. The method is configured to dissipate heat from an electronic element that have self-heat-dissipation functions in an electronic device The method includes the following operations: detecting a first temperature of the electronic element; and controlling a fan of the peripheral element located around the electronic element to dissipate the heat from the electronic element when the first temperature exceeds a first upper temperature threshold.

Another aspect of this disclosure is to provide an electronic device. The electronic device includes a processor, an electronic element with no self-heat-dissipation functions, and a peripheral element located around the electronic element, in which the peripheral element includes a fan. The processor controls the fan of the peripheral element to dissipate heat from the electronic element when the first temperature of the electronic element is greater than a first upper temperature threshold to heat the electronic element.

Embodiments of the present disclosure provide an electronic device and a method for controlling a heat dissipation device, and in particular, an electronic device with a function of controlling a heat dissipation, and a method for controlling the heat dissipation device for dissipating heat from electronic elements without self-heat-dissipation function, so as to dissipate the heat of the electronic elements that do not have their own cooling function without additional space and cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
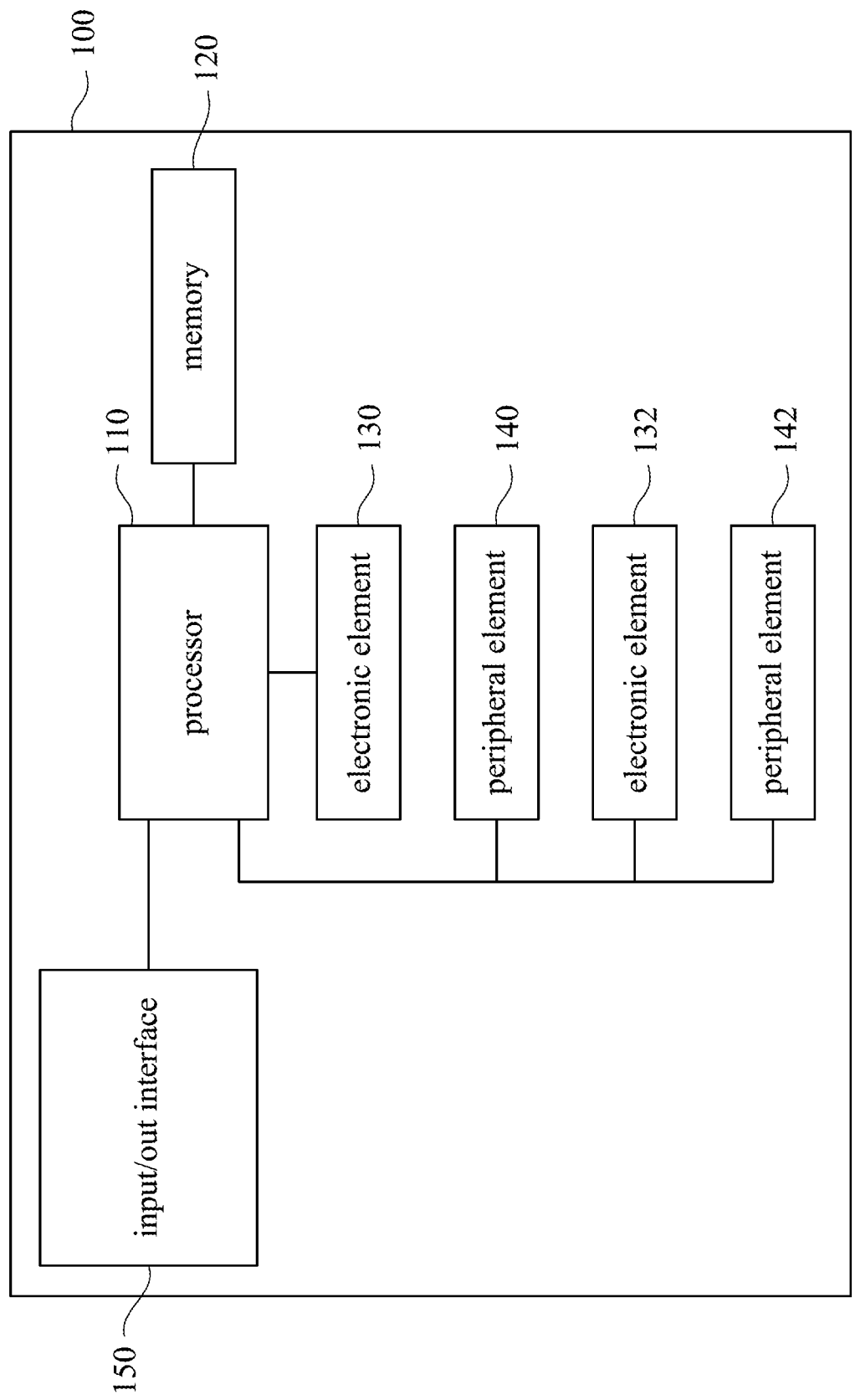
FIG. 1 is a schematic diagram illustrating an electronic device according to some embodiments of the present disclosure.

The following disclosure provides many different embodiments, or examples, for implementing different features of the invention. Specific examples of elements and arrangements are described lower than to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed lower than, or elsewhere in the specification, to provide additional guidance to the practitioner regarding the description of the invention.

FIG. 1 is a schematic diagram illustrating an electronic device 100 according to some embodiments of the present disclosure. As illustrated in FIG. 1, the electronic device 100 includes a processor 110, a memory 120, an electronic element 130, an electronic element 132, a peripheral element 140, a peripheral element 142, and an input/out interface 150. The aforementioned electronic elements 130 and 132 do not have a fan or automatic heat dissipation functions, while the peripheral elements 140 and 142 and the processor 110 have a fan for automatic heat dissipation. The electronic device 100 illustrated in FIG. 1 is merely for illustrative purposes, but the present disclosure is not limited thereto.

In some embodiments, the processor 110 determines that a peripheral element is located around the electronic element 130 or 132. In some embodiments, the electronic device 100 includes several elements with fans, and the processor 110 turns on the fans of the elements alternatively and determines that the elements of which the fan causes the electronic element 130 or 132 to have a maximum value of the temperature change is the peripheral element around the electronic element 130 or 132. For example, if the element that causes the maximum temperature change of the electronic element 130 is the fan of the processor 110, it is determined that the peripheral element of the electronic element 130 is the processor 110. If the element that causes the maximum temperature change of the electronic element 132 is the fan of the peripheral element 142, it is determined that the peripheral element of the electronic element 132 is the peripheral element 142. Alternatively, if the element that causes the maximum temperature change of the electronic element 132 is the fan of the peripheral element 142, it is determined that the peripheral element of the electronic element 132 is the peripheral element 140.

In some embodiments, the processor 110 transmits commands to the electronic element 130 or 132 to request the electronic element 130 or 132 to reply its temperature. The electronic element 130 or 132 detects the temperature of the electronic element 130 or 132, and transmits the detected temperature to the processor 110. In some embodiments, the electronic element 130 or 132 may actively transfer the detected temperature to the processor 110, instead of passively replying the temperature when being requested by the electronic element 130 or 132 in accordance with actual requirements.

In some embodiments, the processor 110 determines whether the temperature of the electronic element 130 or 132 is greater than the first upper temperature threshold or not. If the processor 110 determines that the temperature of the electronic element 130 or 132 is greater than the first upper temperature threshold, the processor 110 controls the fan of the processor 110, the peripheral element 140 or 142 of the electronic element 130 or 132 to dissipate heat from the electronic element 130 or 132. For example, if the processor 110 determines that the temperature of the electronic element 132 is greater than the first upper temperature threshold, the processor 110 controls the fan of the peripheral element 142 to dissipate heat from the electronic element 132. If the processor 110 determines that the temperature of the electronic element 130 is greater than the first upper temperature threshold, the processor 110 controls the fan of the processor 110 to dissipate heat from the electronic element 130.

In some embodiments, the processor 110 determines whether the temperature of the electronic element 130 or 132 is lower than the first lower temperature threshold or not. If the processor 110 determines that the temperature of the electronic element 130 or 132 is lower than the first lower temperature threshold, the processor 110 controls the fan of the processor 110, the peripheral element 140 or 142 of the electronic element 130 or 132 to stop dissipating heat from the electronic element 130 or 132. For example, if the processor 110 determines that the temperature of the electronic element 132 is lower than the first lower temperature threshold, the processor 110 controls the fan of the peripheral element 142 to stop dissipating heat from the electronic element 132.

In some embodiments, the processor 110 increases a voltage applied to and/or a rotational speed of the fan of the processor 110, the peripheral element 140, or 142 when the processor 110 determines that the temperature of the electronic element 130 or 132 is greater than the first upper temperature threshold, to dissipate heat from the electronic element 130 or 132. When the processor 110 determines that the temperature of the electronic element 130 or 132 is lower than the first lower temperature threshold, the processor 110 reduces the voltage applied to and/or the rotational speed of the fan of the processor 110, the peripheral element 140, or 142 to stop dissipating heat from the electronic element 130 or 132.

In some embodiments, when the processor 110 determines that the temperature of the electronic element 130 or 132 is greater than the first upper temperature threshold or lower than the first lower temperature threshold, the processor 110 further determines whether the temperature of the processor 110, the peripheral element 140 or 142 exceeds the second upper temperature threshold or lower than the second lower temperature threshold. If the processor 110 determines that the temperature of the processor 110, the peripheral element 140 or 142 does not exceed the second upper temperature threshold and not lower than the second lower temperature threshold, the processor 110 adjusts the fan of the processor 110, the peripheral element 140 or 142 to dissipate heat from the electronic element 130 or 132 for. For example, if the processor 110 determines that the temperature of the electronic element 132 is greater than the first upper temperature threshold, and the processor 110 determines that the temperature of the peripheral element 142 does not exceed the second upper temperature threshold and not lower than the second lower temperature threshold, the processor 110 adjusts the fan of the peripheral element 142 to dissipate heat of the electronic element 132. If the processor 110 determines that the temperature of the electronic element 132 is lower than the first lower temperature threshold, and the processor 110 determines that the temperature of the peripheral element 142 does not exceed the second upper temperature threshold and not lower than the second lower temperature threshold, the processor 110 adjusts the fan of the peripheral element 142 to stop dissipating heat from the electronic element 132.

In some embodiments, when the processor 110 determines that the temperature of the electronic element 130 or 132 is greater than the first upper temperature threshold or lower than the first lower temperature threshold, and the processor 110 determines that the temperature of the processor 110, the peripheral element 140 or 142 exceeds the second upper temperature threshold or lower than the second lower temperature threshold, the processor 110 determines whether the fan of the processor 110, the peripheral element 140 or 142 needs to be adjusted to dissipate heat from the electronic element 130 or 132 or not. In some embodiments, when the temperature of the electronic element 130 or 132 is greater than the first upper temperature threshold or when the temperature of the peripheral element 140 or 142 is greater than the second upper temperature threshold, The processor 110 determines that the voltage applied to and/or the rotational speed of the fan of the processor 110, the peripheral element 140 or 142 needs to be increased to dissipate heat from the electronic element 130 or 132.

For example, if the processor 110 determines that the temperature of the electronic element 132 is lower than the first lower temperature threshold and the temperature of the peripheral element 142 of the electronic element 132 exceeds the second upper temperature threshold, the processor 110 determines that the voltage applied to and/or the rotational speed of the fan of the peripheral element 142 needs to be increased to dissipate heat from the peripheral element 142. If the processor 110 determines that the temperature of the electronic element 132 is lower than the first lower temperature threshold and the temperature of the peripheral element 142 is lower than the second lower temperature threshold, the processor 110 determines that the voltage applied to and/or rotational speed of the fan of the peripheral element 142 needs to be reduced to stop dissipating heat from the electronic element 132 and the peripheral element 142. In sum, when the temperature of the electronic element 130 or 132 exceeds the first upper temperature threshold, heat dissipation may be performed by the processor 110, the peripheral element 140 or 142. Furthermore, when the temperature of the processor 110, the peripheral element 140 or 142 itself exceeds the second upper temperature threshold, the processor 110, the peripheral element 140 or 142 may also be self-cooled.

In some embodiments, the first upper temperature threshold, the first lower temperature threshold, the second upper temperature threshold, and the second lower temperature threshold are stored in the memory 120. In some embodiments, when the processor 110 determines whether the temperature of the electronic element 130 or 132 exceeds the first upper temperature threshold or lower than the first lower temperature threshold, and when the processor 110 determines whether the temperature of the processor 110, the peripheral element 140 or 142 is greater than the second upper temperature threshold or lower than the second upper temperature threshold value, the processor 110 performs determination according to the first upper temperature threshold value, the first lower temperature threshold value, the second temperature upper threshold value, and the second lower temperature threshold value stored in the memory 120.

In some embodiments, the electronic device 100 further includes an input/output interface 150 for connection with other electronic elements and to input/output commands and/or messages.

Figure 2:
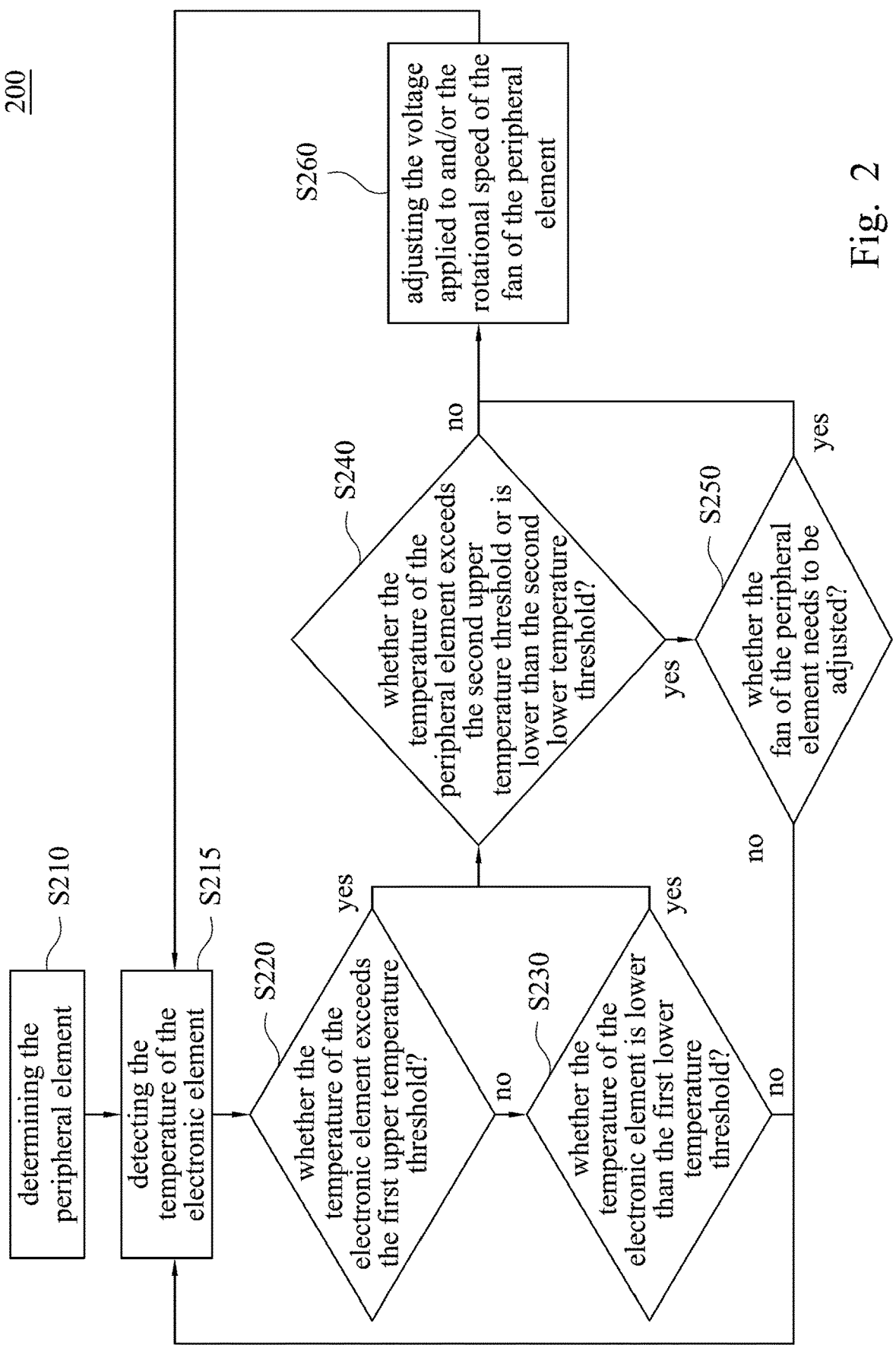
FIG. 2 is a flow chart illustrating a method for controlling a heat dissipation device according to some embodiments of the present disclosure.

Reference is made to FIG. 2. FIG. 2 is a flow chart illustrating a method 200 for controlling a heat dissipation device according to some embodiments of the present disclosure. As shown in FIG. 2, the method 200 for controlling a heat dissipation device includes operations S210 to S260. For understanding the method 200 for controlling a heat dissipation device reference is made to FIG. 1 together with FIG. 2.

Operation S210 is performed to determine the peripheral element. For example, whether the processor 110, the peripheral element 140, or 142 is located around the electronic element 130 or 132 is determined by the processor 110. The detailed determination method is described in the examples above and is not repeated herein.

Operation S215 is performed to detect the temperature of the electronic element. For example, the temperature of the electronic element 130 or 132 is self-detected by the electronic element 130 or 132, and the detected temperature is transmitted to the processor 110. Alternatively, the electronic element 130 or 132 may actively transfer the detected temperature to the processor 110, rather than passively transfer the detected temperature to the processor 110 when being requested by the processor 110. It depends on the actual requirements.

Operation S220 is performed to determine whether the temperature of the electronic element exceeds the first upper temperature threshold. For example, the processor 110 determines whether the temperature of the electronic element 130 or 132 is greater than the first upper temperature threshold. If it is determined that the temperature of the electronic element 130 or 132 exceeds the first upper temperature threshold, operation S240 is performed. If it is determined that the temperature of the electronic element 130 or 132 does not exceed the first upper temperature threshold, operation S230 is performed.

Operation S230 is performed to determine whether the temperature of the electronic element is lower than the first lower temperature threshold. For example, the processor 110 determines whether the temperature of the electronic element 130 or 132 is lower than the first lower temperature threshold or not. If it is determined that the temperature of the electronic element 130 or 132 is lower than the first lower temperature threshold, operation S240 is performed. If it is determined that the temperature of the electronic element 130 or 132 is not lower than the first lower temperature threshold, operation S215 is performed.

Operation S240 is performed to determine whether the temperature of the peripheral element exceeds the second upper temperature threshold or lower than the second lower temperature threshold. For example, the processor 110 determines whether the temperature of the peripheral element 142 of the electronic element 132 exceeds the second upper temperature threshold or is lower than the second lower temperature threshold. If it is determined that the temperature of the peripheral member 142 exceeds the second upper temperature threshold or lower than the second lower temperature threshold, operation S250 is performed. That is, when the determination result of operation S240 is that the temperature of the processor 110, the peripheral element 140 or 142 exceeds the second upper temperature threshold or lower than the second lower temperature threshold, the temperature of the electronic element 130 or 132 and the temperature of the processor 110, the peripheral element 140 or 142 should be taken into consideration, and the processor 110 determines whether the fans of the processor 110, the peripheral element 140 or 142 need to be adjusted according to the temperature of the electronic element 130 or 132 and the temperature of the processor 110, the peripheral element 140 or 142. If it is determined that the temperature of the processor or the peripheral element does not exceed the second temperature upper threshold and not lower than the second lower temperature threshold, operation S260 is performed. That is, when the determination result of operation S240 is that the temperature of the processor 110, the peripheral element 140 or 142 does not exceed the second upper temperature threshold value and not lower than the second lower temperature threshold, it is not necessary to take the temperature of the processor 110, the peripheral element 140 or 142 into consideration, and the fan of the processor 110, the peripheral element 140 or 142 may be adjusted only according to the temperature of the electronic element 130 or 132.

Operation S250 is performed to determine whether the fan of the peripheral element needs to be adjusted. In operation S250, when the temperature of one of the electronic element and the peripheral element exceeds the upper limit of the temperature, it is determined that the voltage applied to and/or the rotational speed of the fan of the peripheral element is required to heat the electronic element. That is, when the electronic element exceeds the first upper temperature threshold or the peripheral element exceeds the second upper temperature threshold, it is determined that the voltage applied to and/or the rotational speed of the fan of the peripheral element is increased to dissipate heat from the electronic element or the peripheral element. If the electronic element and the peripheral element are both lower than the lower temperature threshold, it is determined that the voltage applied to and/or the rotational speed of the fan of the peripheral element is reduced to stop dissipating heat from the electronic element. If the fan of the peripheral element is to be adjusted, operation S260 is performed. If the fan of the peripheral element is not adjusted, operation S215 is performed.

Operation S260 is performed to adjust the voltage applied to and/or the rotational speed of the fan of the peripheral element. In some embodiments, the processor 110 may adjust the voltage applied to and/or the rotational speed of the fan of the peripheral element by modifying the interface parameters of the input and output system (BIOS). After performing operation S260, operation S215 is performed to detect the temperature of the electronic element.

In some embodiments, the electronic element 130 or 132 may be a solid-state hard disk, an amplifier or a memory of a sound interface, or any element that does not have a self-heat-dissipation device or function. In some embodiments, the peripheral element may be any element of a processor, a display card, or an active fan having a self-heat-dissipation device or function.

In some embodiments, the processor 110 may be a server, a circuit, a central processing unit (CPU), a microprocessor (MCU) having a function of storing, computing, data reading, or other device having the same functionality.

According to embodiments of the present disclosure, it is understood that the embodiments of the present disclosure provide an electronic device with a function of controlling a heat dissipation device, and a method for controlling the heat dissipation device, and in particular, the function and the method controls the heat dissipation device to dissipate heat from electronic elements that has no self-heat-dissipation function, so as to dissipate the heat of the electronic elements that do not have their own cooling functions without needing additional space and cost.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a heat dissipation device to dissipate heat from an electronic element in an electronic device, the electronic element having no self-heat-dissipation function, the method comprising:
    providing a plurality of elements of the electronic device and a plurality of fans corresponding to the elements in a one-to-one manner;
    determining a peripheral element, wherein the peripheral element has one of the elements and the fan corresponding to the one of the elements;
    detecting a first temperature of the electronic element; and
    controlling the fan of the peripheral element located in the electronic device to dissipate heat from the electronic element when the first temperature exceeds a first upper temperature threshold;
    wherein determining the peripheral element comprises:
    turning on the elements of the electronic device alternatively, wherein when one of the elements is turned on, the fan correspondingto the one of the elements is turned on accordingly;
    detecting a temperature change of the electronic element when the elements of the electronic device are alternatively turned on, thereby obtaining a plurality of values of temperature change corresponding to the elements in a one-to-one manner; and
    determining that the element of which the fan capable of causing the electronic element to have a maximum value among the values of the temperature change is the peripheral element.

2. The method of claim 1, further comprising:
    controlling the fan of the peripheral element located in the electronic device to stop dissipating heat from the electronic element when the first temperature is lower than a first lower temperature threshold.

3. The method of claim 2, wherein controlling the fan of the peripheral element located in the electronic device comprises:
    increasing a voltage applied to and/or a rotational speed of the fan of the peripheral element when the first temperature exceeds the first upper temperature threshold; and
    lowering the voltage applied to and/or the rotational speed of the fan of the peripheral element when the first temperature is lower than the first lower temperature threshold.

4. The method of claim 1, wherein controlling the fan of the peripheral element located in the electronic device comprises:
    controlling a voltage applied to and/or a rotational speed of the fan of the peripheral element.

5. The method of claim 1, wherein controlling the fan of the peripheral element located in the electronic device comprises:
    transmitting a control command to the peripheral element to control the fan of the peripheral element.

6. The method of claim 1, wherein controlling the fan of the peripheral element located in the electronic device comprises:
    detecting a second temperature of the peripheral element; and
    increasing a voltage applied to and/or a rotational speed of the fan of the peripheral element when the second temperature exceeds a second upper temperature threshold.

7. The method of claim 6, further comprising:
    increasing the voltage applied to and/or the rotational speed of the fan of the peripheral element when the second temperature exceeds the second upper temperature threshold or when the first temperature exceeds the first upper temperature threshold.

8. An electronic device, comprising:
    a processor;
    an electronic element with no self-heat-dissipation functions;
    a plurality of elements of the electronic device; and
    a plurality of fans corresponding to the elements in a one-to-one manner;
    wherein the processor determinesa peripheral element having one of the elements and the fan corresponding to the one of the elements, and controls the fan of the peripheral element to dissipate heat from the electronic element when the first temperature of the electronic element is greater than a first upper temperature threshold, wherein the peripheral element is located in the electronic device;
    wherein when the processor determinesthe peripheral element, the processor is further configured to:
    turn on the elements of the electronic device alternatively, wherein when one of the elements is turned on, the fan correspondingto the one of the elements is turned on accordingly;

detect a temperature change of the electronic element when the elements of the electronic device are alternatively turned on, thereby obtaining a plurality of values of temperature change corresponding to the elements in a one-to-one manner; and determine that the element of which the fan capable of causing the electronic element having a maximum value among the values of the temperature change is the peripheral element.

9. The electronic device of claim 8, wherein the processor is further configured to control the fan of the peripheral element located in the electronic device to stop dissipating heat from the electronic element when the first temperature is lower than a first lower temperature threshold.

10. The electronic device of claim 8, wherein the processor is further configured to control a voltage and/or a rotational speed of the fan of the peripheral element.

11. The electronic device of claim 8, wherein the processor is further configured to increase a voltage and/or a rotational speed of the fan of the peripheral element when the first temperature exceeds the first upper temperature threshold, and the processor is configured to reduce the voltage and/or the rotational speed of the fan of the peripheral element when the first temperature is lower than the first lower temperature threshold.

12. The electronic device of claim 8, wherein the processor is further configured to increase a voltage and/or a rotational speed of the fan of the peripheral element when a second temperature of the peripheral element exceeds a second upper temperature threshold.

13. The electronic device of claim 12, wherein the processor is further configured to determine whether the second temperature exceeds the second upper temperature threshold.

14. The electronic device of claim 12, wherein the processor is further configured to increase the voltage and/or the rotational speed of the fan of the peripheral element when the second temperature exceeds the second upper temperature threshold or when the first temperature exceeds the first upper temperature threshold.

15. The electronic device of claim 8, wherein the processor is further configured to transmit a control command to the peripheral element to control the fan of the peripheral element.

16. The electronic device of claim 8, wherein the electronic element is further configured to detect the first temperature of the electronic element.

17. The electronic device of claim 16, wherein the electronic element is further configured to actively transfer the first temperature to the processor.

18. The electronic device of claim 8, wherein the processor is further configured to determine whether the first temperature is within a range from a first lower temperature threshold to the first upper temperature threshold.

19. An electronic device, comprising:
a processor;
an electronic element with no self-heat-dissipation functions;
a plurality of peripheral elements of the electronic device; and
a plurality of peripheral element fans corresponding to the peripheral elements in a one-to-one manner and directly and respectively associated with the peripheral elements to cool the peripheral elements;
wherein the processor is configured to:
select a designated peripheral element and a designated peripheral element fan from at least one of the peripheral elements and the peripheral element fan associated therewith; and
control the designated peripheral element fan of the designated peripheral element to dissipate heat from the electronic element when a first temperature of the electronic element is greater than a first upper temperature threshold;
wherein the designated peripheral element is located in the electronic device, and the designated peripheral element fan is not directly associated with the electronic element to cool the electronic element;
wherein when the processor selects the designated peripheral element and the designated peripheral element fan, the processor is further configured to:
turn on the plurality of the peripheral elements of the electronic device alternatively;
detect a temperature change of the electronic element when the peripheral elements of the electronic device are alternatively turned on, thereby obtaining a plurality of values of temperature change corresponding to the peripheral elements in a one-to-one manner; and
select the peripheral element and the peripheral element fan associated therewith that is capable of causing the electronic element to have a maximum value of temperature change from among the values of the temperature change as the designated peripheral element and the designated peripheral element fan.

20. The electronic device of claim 19, further comprising a processor fan corresponding to the processor and directly associated with the processor to cool the processor; and wherein the processor selects the designated peripheral element and the designated peripheral element fan from among the peripheral elements and the peripheral element fans, and the processor and the processor fan.

* * * * *